United States Patent
Fujita et al.

(10) Patent No.: US 10,147,842 B2
(45) Date of Patent: Dec. 4, 2018

(54) METHOD OF PRODUCING III NITRIDE SEMICONDUCTOR LIGHT-EMITTING DEVICE

(71) Applicant: DOWA Electronics Materials Co., Ltd., Chiyoda-ku, Tokyo (JP)

(72) Inventors: Takehiko Fujita, Gotenba (JP); Yasuhiro Watanabe, Akita (JP)

(73) Assignee: DOWA Electronics Materials Co., Ltd., Chiyoda-ku, Tokyo (JP)

( * ) Notice: Subject to any disclaimer, the term of this patent is extended or adjusted under 35 U.S.C. 154(b) by 0 days.

(21) Appl. No.: 15/533,482

(22) PCT Filed: Dec. 8, 2015

(86) PCT No.: PCT/JP2015/006099
§ 371 (c)(1),
(2) Date: Jun. 6, 2017

(87) PCT Pub. No.: WO2016/092822
PCT Pub. Date: Jun. 16, 2016

(65) Prior Publication Data
US 2018/0166604 A1    Jun. 14, 2018

(30) Foreign Application Priority Data

Dec. 8, 2014 (JP) ................................ 2014-248291
Dec. 7, 2015 (JP) ................................ 2015-238859

(51) Int. Cl.
*H01L 33/00* (2010.01)
*C23C 16/34* (2006.01)
(Continued)

(52) U.S. Cl.
CPC ............ *H01L 33/005* (2013.01); *C23C 16/34* (2013.01); *H01L 21/0242* (2013.01);
(Continued)

(58) Field of Classification Search
CPC ...................................................... H01L 33/005
See application file for complete search history.

(56) References Cited

U.S. PATENT DOCUMENTS

| 2009/0121320 A1* | 5/2009 | Tsuda | B82Y 20/00 257/613 |
| 2010/0035410 A1* | 2/2010 | Sonobe | C23C 16/303 438/478 |
| 2012/0049157 A1* | 3/2012 | Nago | H01L 21/02389 257/13 |

FOREIGN PATENT DOCUMENTS

| JP | 2010205767 A | 9/2010 |
| JP | 5060656 B2 | 10/2012 |

(Continued)

OTHER PUBLICATIONS

Mar. 1, 2016, International Search Report issued in the International Patent Application No. PCT/JP2015/006099.

(Continued)

*Primary Examiner* — Bradley K Smith
(74) *Attorney, Agent, or Firm* — Kenja IP Law PC (57) ABSTRACT

We propose a method of producing a III nitride semiconductor light-emitting device 1 having a p-type semiconductor layer 150 in this order, wherein the p-type semiconductor layer 150 is formed by the steps comprising: an electron blocking layer formation step for forming an electron blocking layer 51 having an Al content higher than that of the barrier layer 42, on the light emitting layer 40; a nitrogen carrier gas supply step for supplying at least a carrier gas containing nitrogen as a main component to a surface of the electron blocking layer 51; and a second p-type contact formation step for forming a second p-type contact layer 55 made of $Al_yGa_{1-y}N$ on the electron blocking layer 51 after the nitrogen carrier gas supply step, and wherein the second (Continued)

p-type contact formation step is performed using a carrier gas containing hydrogen as a main component.

10 Claims, 3 Drawing Sheets

(51) Int. Cl.
*H01L 33/06* (2010.01)
*H01L 33/14* (2010.01)
*H01L 33/30* (2010.01)
*H01L 33/32* (2010.01)
*H01S 5/343* (2006.01)
*H01L 21/02* (2006.01)
*B82Y 40/00* (2011.01)

(52) U.S. Cl.
CPC ...... *H01L 21/0254* (2013.01); *H01L 21/0262* (2013.01); *H01L 21/02433* (2013.01); *H01L 21/02458* (2013.01); *H01L 21/02579* (2013.01); *H01L 33/00* (2013.01); *H01L 33/06* (2013.01); *H01L 33/14* (2013.01); *H01L 33/30* (2013.01); *H01L 33/32* (2013.01); *H01S 5/343* (2013.01); *B82Y 40/00* (2013.01)

(56) References Cited

FOREIGN PATENT DOCUMENTS

| | | |
|---|---|---|
| JP | 2013115105 A | 6/2013 |
| WO | 2008153068 A1 | 12/2008 |

OTHER PUBLICATIONS

Feb. 16, 2016, Notification of Reasons for Refusal issued by the Japan Patent Office in the corresponding Japanese Patent Application No. 2015-238859.

Jun. 13, 2017, International Preliminary Report on Patentability issued in the International Patent Application No. PCT/JP2015/006099.

Jun. 5, 2018, Office Action issued by the State Intellectual Property Office in the corresponding Chinese Patent Application No. 201580067006.3.

Sep. 17, 2018, Office Action issued by the Taiwan Intellectual Property Office in the corresponding Taiwanese Patent Application No. 104141166.

\* cited by examiner

METHOD OF PRODUCING III NITRIDE SEMICONDUCTOR LIGHT-EMITTING DEVICE

TECHNICAL FIELD

This disclosure relates to a method of producing a III nitride semiconductor light-emitting device, and more particularly to a method of producing a III nitride semiconductor light-emitting device, which makes it possible to improve the lifetime of the device.

BACKGROUND

III nitride semiconductors formed from compounds in which N is combined with Al, Ga, In, and the like have conventionally been used as materials for ultraviolet light-emitting devices. III nitride semiconductors made of high-Al-content AlGaN are particularly used for ultraviolet light-emitting devices or deep ultraviolet light light-emitting devices (DUV-LED) emitting light at a wavelength of 300 nm or less.

Examples of the characteristics required of a light-emitting device include high external quantum efficiency properties and low resistance properties. JP 2010-205767 A (PTL 1) describes that a layer serving as an energy barrier for electrons that is called an electron blocking layer is formed between a light emitting layer having a quantum well structure and a p-cladding layer, thereby increasing the light emission efficiency.

CITATION LIST

Patent Literature

PTL 1: JP 2010-205767 A

SUMMARY

Technical Problem

A light-emitting device manufactured by the method of PTL 1 has excellent light intensity, but leaves room for improvement in its lifetime. In view of the above, it could be helpful to provide a method of producing a III nitride semiconductor light-emitting device, which makes it possible to improve the lifetime of the device.

Solution to Problem

The inventors of the disclosure made various studies on ways to solve the above problem. As a result, they found it significantly effective to provide a p-type contact layer having a two-layer structure, on an electron blocking layer without providing a p-type cladding layer. The two-layer structure includes a first p-type contact layer formed directly on the electron blocking layer using a carrier gas containing nitrogen as a main component and a second p-type contact layer formed on the first p-type contact layer using a carrier gas containing hydrogen as a main component.

The inventors of the disclosure found that the lifetime of the device is improved in the above method due not to the formation of the two-layered p-type contact layer on the electron blocking layer but to, after forming the electron blocking layer, supplying at least a carrier gas containing nitrogen as a main component to a surface of the electron blocking layer to expose the surface of the electron blocking layer to the nitrogen containing atmosphere.

The inventors also found that one of the p-type contact layers, that is the first p-type contact layer, is preferably rather not formed (i.e, no group III element gas is supplied) while the carrier gas containing nitrogen as a main component is supplied, in terms of improving the lifetime. Moreover, they found that the lifetime of the device can be further improved by forming the p-type contact layer (second p-type contact layer) using a carrier gas containing hydrogen as a main component after exposing the surface of the electron blocking layer to the nitrogen containing atmosphere, as compared to the case of employing the two-layered p-type contact layer. These discoveries led to the present invention.

Specifically, we propose the following features.

(1) A method of producing a III nitride semiconductor light-emitting device having an n-type semiconductor layer; a light emitting layer having a quantum well structure including a well layer containing at least Al and a barrier layer; and a p-type semiconductor layer in this order, wherein the p-type semiconductor layer is formed by the steps comprising: an electron blocking layer formation step for forming an electron blocking layer having an Al content higher than that of the barrier layer, on the light emitting layer; a nitrogen carrier gas supply step for supplying at least a carrier gas containing nitrogen as a main component to a surface of the electron blocking layer; and a second p-type contact formation step for forming a second p-type contact layer made of $Al_yGa_{1-y}N$, where y satisfies $0 \le y \le 0.1$ on the electron blocking layer after the nitrogen carrier gas supply step. The second p-type contact formation step is performed using a carrier gas containing hydrogen as a main component.

(2) The method of producing a III nitride semiconductor light-emitting device, according to (1) above, wherein the nitrogen carrier gas supply step is initiated by stopping the supply of source gases of Al and Ga.

(3) The method of producing a III nitride semiconductor light-emitting device, according to (1) above, wherein in the nitrogen carrier gas supply step, source gases of Al and Ga are further supplied to form a first p-type contact layer made of $Al_xGa_{1-x}N$, where x satisfies $0 \le x \le 0.1$, with a thickness of more than 0 nm and 30 nm or less directly on the electron blocking layer and directly under the second p-type contact layer.

(4) The method of producing a III nitride semiconductor light-emitting device, according to any one of (1) to (3) above, wherein the barrier layer is $Al_bGa_{1-b}N$, where b satisfies $0.35 \le b \le 0.95$, and the electron blocking layer is $Al_zGa_{1-z}N$, where z satisfies $b < z \le 1$.

(5) The method of producing a III nitride semiconductor light-emitting device, according to any one of (1) to (4) above, wherein light emitted from the light emitting layer is deep ultraviolet light having a center wavelength of 320 nm or less.

(6) A method of producing a III nitride semiconductor light-emitting device having an n-type semiconductor layer; a light emitting layer having a quantum well structure including a well layer containing at least Al and a barrier layer; and a p-type semiconductor layer in this order, wherein the p-type semiconductor layer is formed by the steps comprising: an electron blocking layer formation step for forming an electron blocking layer having an Al content higher than that of the barrier layer, on the light emitting layer; a first p-type contact formation step for forming a first p-type contact layer made of $Al_xGa_{1-x}N$, where x satisfies $0 \le x \le 0.1$, directly on the electron blocking layer, and a second p-type contact formation step for forming a second p-type contact layer made of $Al_yGa_{1-y}N$, where y satisfies $0 \leq y \leq 0.1$, directly on the first p-type con contact layer. The first p-type contact formation step is performed using a carrier gas containing nitrogen as a main component, and the second p-type contact formation step is performed using a carrier gas containing hydrogen as a main component.

(7) The method of producing a III nitride semiconductor light-emitting device, according to (6) above, wherein a thickness of the first p-type contact layer is smaller than that of the second p-type contact layer.

(8) The method of producing a III nitride semiconductor light-emitting device, according to (6) or (7) above, wherein the thickness of the first p-type contact layer is 5 nm or more and 30 nm or less.

(9) The method of producing a III nitride semiconductor light-emitting device, according to any one of (6) to (8) above, wherein the barrier layer is $Al_bGa_{1-b}N$, where b satisfies $0.4 \leq b \leq 0.95$, and the electron blocking layer is $Al_zGa_{1-z}N$, where z satisfies $b < z \leq 1$.

(10) The method of producing a III nitride semiconductor light-emitting device, according to any one of (6) to (9) above, wherein light emitted from the light emitting layer is deep ultraviolet light having a center wavelength of 300 nm or less.

(11) The method of producing a III nitride semiconductor light-emitting device, according to any one of (6) to (10) above, wherein the electron blocking layer formation step is performed using a carrier gas containing hydrogen as a main component, and the method includes a step for flowing a carrier gas containing nitrogen as a main component without flowing a metalorganic gas after the electron blocking layer formation step.

Advantageous Effect

According to this disclosure, the lifetime of a device can be significantly improved.

BRIEF DESCRIPTION OF THE DRAWINGS

In the accompanying drawings.

DETAILED DESCRIPTION (First Embodiment: Method of Producing III Nitride Semiconductor Light-emitting Device)

Embodiments will now be described with reference to the drawings. In principle, like components are denoted by the same reference numerals, and the description of those components will not be repeated. A sapphire substrate and layers in each diagram are exaggerated for the sake of explanation, so that the aspect ratio does not conform to the actual ratio.

A method of producing a III nitride semiconductor light-emitting device according to a first embodiment is a method of producing a III nitride semiconductor light-emitting device having an n-type semiconductor layer; a light emitting layer having a quantum well structure including a well layer containing at least Al and a barrier layer; and a p-type semiconductor layer in this order. Here, it is important that the p-type semiconductor layer is formed by the steps including: an electron blocking layer formation step for forming an electron blocking layer having an Al content higher than that of the barrier layer, on the light emitting layer; a first p-type contact formation step for forming a first p-type contact layer made of $Al_xGa_{1-x}N$ ($0 \leq x \leq 0.1$) directly on the electron blocking layer; and a second p-type contact formation step for forming a second p-type contact layer made of $Al_yGa_{1-y}N$ ($0 \leq y \leq 0.1$) directly on the first p-type contact layer; the first p-type contact formation step is performed using a carrier gas containing nitrogen as a main component, and the second p-type contact formation step is performed using a carrier gas containing hydrogen as a main component.

Figure 1:
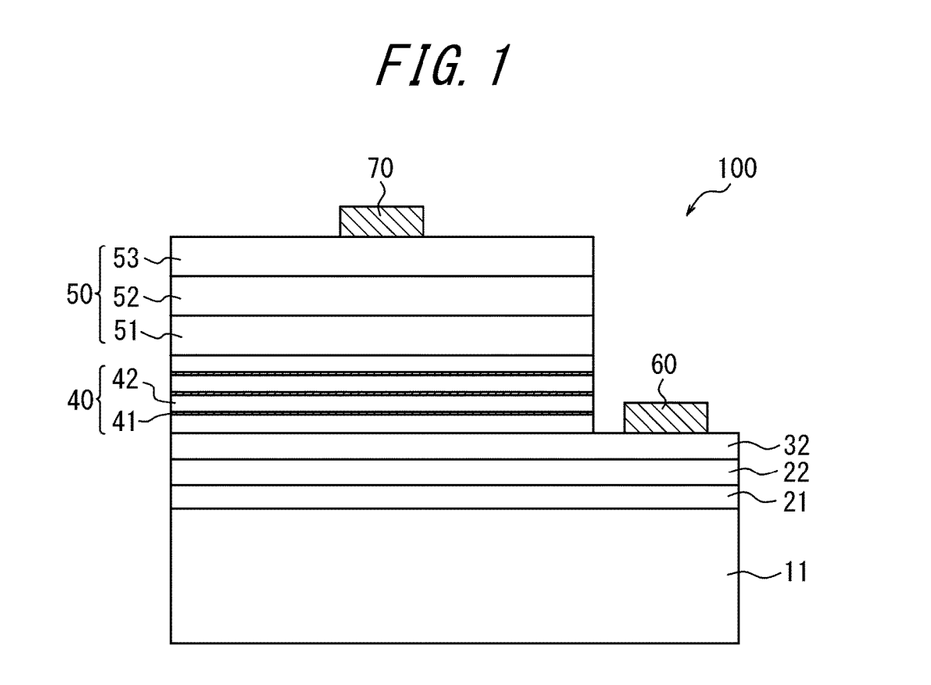
FIG. 1 is a schematic cross-sectional view of a III nitride semiconductor light-emitting device of Conventional Example 1.

In attempts to improve the lifetime of a semiconductor light-emitting device as compared to conventional devices, the inventors noted the p-type semiconductor layer 50 in the light-emitting device 100 of Conventional Example 1 depicted in FIG. 1. An electron blocking layer 51, a p-type cladding layer 52, and a p-type contact layer 53 composing the p-type laminate 50 are typically formed by supplying to a chamber, a source gas of, for example, trimethylgallium (TMG) as a carrier gas containing hydrogen as a main component. In order to ascertain the function and effect of the p-type cladding layer 52, the inventors fabricated a light-emitting device by directly forming the p-type contact layer 53 using a carrier gas containing hydrogen as a main component without forming the p-type cladding layer 52 on the electron blocking layer 51 in attempt to examine the light emission characteristics of the device. However, the device failed to emit light. These results once made the inventors believe that the p-type cladding layer 52 was necessary.

The inventors thought that the device obtained in the above manner failed to emit light because hydrogen contained in the carrier gas caused etching of the electron blocking layer 51, deteriorating the crystallinity, and as a result, the electron blocking layer 51 failed to sufficiently perform its function. Next, the p-type cladding layer 52 was replaced and only the p-type contact layer 53 was formed using a carrier gas containing nitrogen instead of hydrogen as a main component. The resulting device emitted light; however, its lifetime was found to be even shortened as compared to the conventional devices. Here, the p-type cladding layer 52 was removed and the p-type contact layer 53 was formed using a carrier gas containing nitrogen instead of hydrogen as a main component. As a result, a light-emitting device having a lifetime as long as or slightly longer than that of the conventional device was obtained. However, there was still room for improvement relative to the lifetime required in the market.

In the case where the p-type cladding layer 52 was not provided, the device succeeded in emitting light with the use of a gas containing nitrogen as a main component as a carrier gas; accordingly, it seemed that the crystallinity of the electron blocking layer 51 was maintained, thereby sufficiently blocking electrons of the light emitting layer 40. The reduction in the lifetime was attributed to the deteriorated crystallinity of the p-type contact layer 53 itself.

This being the case, the inventors diligently studied ways to obtain the p-type contact layer 53 with high crystallinity without affecting the function of the electron blocking layer 51 even in the case where the p-type cladding layer 52 is not provided. When the p-type contact layer 53 had a two-layer structure, the first p-type contact layer was formed directly on the electron blocking layer 51 using a carrier gas containing nitrogen as a main component, and the second p-type contact layer was formed directly on the first p-type contact layer using a carrier gas containing hydrogen as a main component; the lifetime of the device was significantly improved as compared to the conventional device. This discovery led to the present invention.

Figure 3A:
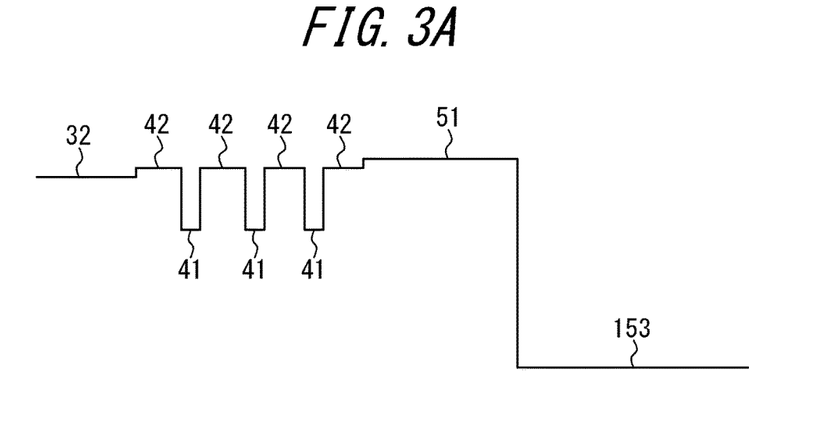
FIG. 3A illustrates a band structure of the conduction bands in Example 1.
Figure 3B:
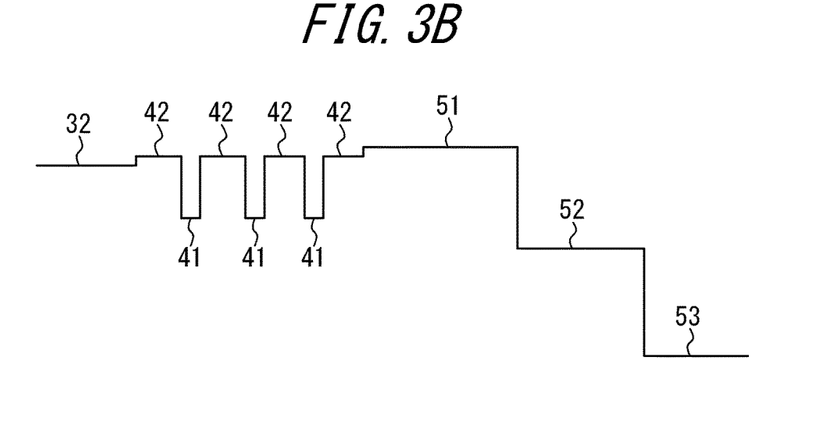
FIG. 3B illustrates a band structure of the conduction bands in Conventional Example 1.

FIGS. 3A and 3B illustrate band structures of the conduction band in Example 1 and Conventional Example 1, respectively, whose details are described later in EXAMPLES. In Example 1, a cladding layer which has conventionally been considered necessary is not provided. Considering the results of Example 1, it is preferable that a layer which is likely to have deteriorated carrier injection efficiency due to reduction in the concentration of p-type carriers caused by slight defect changes, and a minimal structure composed of only an electron blocking layer 51 and a p-type contact layer 153 seems to have reduced variation in the carrier injection efficiency and reduced changes of the light-emitting device over time. A carrier gas containing nitrogen as a main component was used for the first p-type contact layer 154 formed directly on the electron blocking layer 51, and other carrier gases used contained hydrogen as a main component, which allowed the vicinity of the interface between the electron blocking layer 51 and the p-type contact layer 153 to play a role considered to be played by a conventional cladding layer, although no cladding layer was provided. Thus, a long-lifetime light-emitting device with excellent light emission characteristics was obtained.

Figure 2:
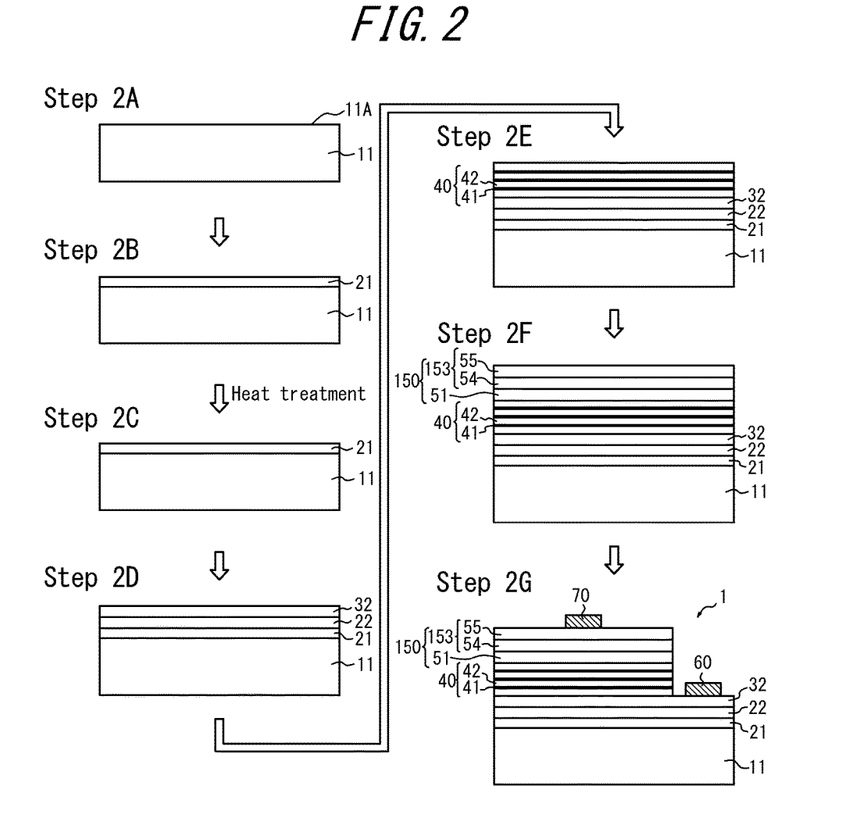
FIG. 2 illustrates process steps in a method of producing a III nitride semiconductor light-emitting device according to a preferred aspect of a first embodiment.

As described above, the manner of forming a p-type semiconductor layer 50 provided on a light emitting layer 40 is significant in this disclosure, which does not limit the specific structure of a sapphire substrate 11, an AlN layer 21, an undoped layer 22, an n-type semiconductor layer 32, and the light emitting layer 40 that are provided under the p-type semiconductor layer 50 as illustrated in Step 2G of FIG. 2.

The Steps 2A to 2G of FIG. 2 illustrate process steps in a method of producing a III nitride semiconductor light-emitting device according to a preferred aspect of a first embodiment. First, as depicted in Step 2A, a sapphire substrate 11 is prepared. A main surface 11A of the sapphire substrate 11 may optionally have an off-angle. The crystallographic orientation in the inclination direction may be either in the m-axis direction or in the a-axis direction; for example, the C-plane may be inclined at an off-angle of 0.5° as described in Japanese Patent Application No. 2014-224637.

Next, as depicted in Step 2B, the AlN layer 21 is epitaxially grown on the sapphire substrate 11. The AlN layer 21 can be formed by a known thin film deposition technique, for example, by metalorganic chemical vapor deposition (MOCVD), molecular beam epitaxy (MBE), or sputtering.

For the Al source for the AlN layer 21, trimethylaluminum (TMA) can be used. Meanwhile, for the N source, ammonia ($NH_3$) gas can be used. Those source gases are used with hydrogen gas as a carrier gas to form the AlN layer 21.

Note that the growth temperature of the AlN layer 21 is preferably 1270° C. or more and 1350° C. or less, more preferably 1290° C. or more and 1330° C. or less. With this temperature range, the crystallinity of the AlN layer 21 can be improved after the subsequent heat treatment. Further, the growth pressure in the chamber can be, for example, 5 Torr to 20 Torr. More preferably, the growth pressure is 8 Torr to 15 Torr.

The molar ratio of a group V element gas such as $NH_3$ gas to a group III element gas such as TMA gas, calculated based on the growth gas flow rate of the group V element gas and the group III element gas (hereinafter referred to as V/III ratio) can be, for example, 130 or more and 190 or less. More preferably, the V/III ratio is 140 or more and 180 or less. Note that since the growth temperature and the growth pressure determine the optimum V/III ratio, the growth gas flow rate is preferably determined appropriately.

Subsequently, the AlN layer 21 on the sapphire substrate 11, obtained as described above is preferably subjected to a heat treatment at a temperature higher than the growth temperature of the AlN layer 21. The heat treatment process can be performed using a known heat treatment furnace. Performing the heat treatment makes the half width of the X-ray rocking curve of the (10-12) plane of the AlN layer 21 be 400 s or less; thus, high crystallinity can be achieved (Step 2C).

After that, as depicted in Step 2D, a layered structure having the undoped layer 22 and the n-type semiconductor layer 32 in this order can be formed on the AlN layer 21.

Next, as depicted in Step 2E, the light emitting layer 40 is formed. The light emitting layer 40 contains at least Al, and can be formed from, for example, an $Al_aGa_{1-a}N$ material ($0<a\leq1$). Here, the Al content is suitably set so that light having the desired wavelength is emitted. When the Al content a is 0.35 or more, the center wavelength of the light emitted from the light emitting layer 40 is 300 nm or less. In this case, the III nitride semiconductor light-emitting device 1 to be ultimately obtained is a DUV-LED.

This light emitting layer 40 can have a multiple quantum well (MQW) structure in which well layers 41 and barrier layers 42 formed from AlGaN having different Al contents are repeatedly formed. The Al content a of the well layers 41 is, for example, 0.3 to 0.8. The Al content b of the barrier layers 42 is higher than the Al content a of the well layers 41, for example, 0.40 to 0.95. Further, the number of repetitions of the well layers 41 and barrier layers 42 is, for example, 1 to 10. The thickness of the well layers 41 is 0.5 nm to 5 nm, whereas the thickness of the barrier layers 42 is 3 nm to 30 nm.

When the light emitting layer 40 is formed from an AlGaN material, for the Al source, TMA can be used; for the Ga source, trimethylgallium (TMG); and for the N source, $NH_3$ gas. Those source gases are supplied into a chamber using hydrogen gas as a carrier gas, thereby forming the light emitting layer 40. When the light emitting layer 40 has a MQW structure, the ratio between the flow rate of the Al source and the flow rate of the Ga source is suitably changed, thereby forming the light emitting layer 40 having a MQW structure.

When the light emitting layer 40 is formed from an $Al_aGa_{1-a}N$ material ($0<a\leq1$), the growth temperature of the $Al_aGa_{1-a}N$ material is preferably 1000° C. or more and 1400° C. or less, more preferably 1050° C. or more and 1350° C. or less.

The molar ratio of a group V element gas such as $NH_3$ gas to a group III element gas such as TMA gas, calculated based on the growth gas flow rate of the group V element gas and the group III element gas (hereinafter referred to as V/III ratio) can be, for example, 100 or more and 100000 or less. More preferably, the V/III ratio is 300 or more and 30000 or less. Since the growth temperature and the growth pressure determine the optimum V/III ratio, the growth gas flow rate is preferably determined appropriately as in the case of the AlN layer 21.

Subsequently, as depicted in Step 2F, a p-type semiconductor layer 150 is formed on the light emitting layer 40. As described above, the p-type semiconductor layer 150 does not include a layer corresponding to the p-type cladding layer 52 illustrated in FIG. 1, and has the electron blocking layer 51 and a p-type contact layer 153 provided directly on the electron blocking layer 51. The p-type contact layer 153 has a two-layer structure composed of a first p-type contact layer 54 and a second p-type contact layer 55.

The electron blocking layer 51 is typically a layer provided between the light emitting layer and the p-type cladding layer to stop electrons and inject the electrons into the light emitting layer 40 (well layers 41 in the case of the MQW) thereby improving the electron injection efficiency. In particular, when the Al content of the light emitting layer 40 is high, the hole concentration of the p-type semiconductor layer is low, which makes it difficult to inject holes into the light emitting layer 40, and the electrons would partly flow to the p-type semiconductor layer side. However, the provision of the electron blocking layer 51 allows such a flow of electrons to be avoided. Note that the "electron blocking layer" herein means a layer having an Al content z that is higher than the Al content b of the barrier layers 42 constituting part of the light emitting layer 40, and having a large band gap. On the other hand, the "cladding layer" herein refers to a layer having an Al content more than 0.1 lower than that of the electron blocking layer and more than 0.1 higher than that of the p-type contact layer. Note that when p-type AlGaN used for a center wavelength of 300 nm or less has a higher Al content, the current more hardly flows. Accordingly, a conventional cladding layer often has an Al content equal to or lower than that of conventional barrier layers. Therefore, the disclosed electron blocking layer and a conventional cladding layer can also be distinguished based on the Al content of barrier layers.

The electron blocking layer 51 can be formed from, for example, a p-type $Al_zGa_{1-z}N$ material ($b<z\leq1$). Although depending on the Al content of the barrier layers 42, the Al content of the electron blocking layer 51 is preferably, for example, 0.5 or more and 1.0 or less. Such a structure can increase the injection efficiency of electrons into the well layers 41. Further, the thickness of the electron blocking layer 51 is preferably, for example, 6 nm to 60 nm. When the thickness of the electron blocking layer 51 is either smaller than 6 nm or larger than 60 nm, the output is significantly reduced. The thickness of the electron blocking layer 51 is preferably larger than that of the barrier layers.

A dopant used to impart p-type conductivity to the electron blocking layer 51 may be magnesium (Mg) or zinc (Zn). For the Mg source, bis(cyclopentadienyl)magnesium ($CP_2Mg$) can be used, and for the Zn source, zinc chloride ($ZnCl_2$) can be used.

When the electron blocking layer 51 is formed from a p-type $Al_zGa_{1-z}N$ material ($b<z\leq1$), a gas containing hydrogen as a main component can be used as a carrier gas. The electron blocking layer 51 can be formed by supplying TMA, TMG, and $NH_3$ gas, which are source gases, and for example $CP_2Mg$, which is an impurity gas, along with the carrier gas into a chamber. Note that when a gas containing nitrogen as a main component is used from the beginning of the formation of the electron blocking layer 51, the device fails to emit light.

When the electron blocking layer 51 is formed from an $Al_zGa_{1-z}N$ material ($b<z\leq1$), the growth temperature of the $Al_bGa_{1-b}N$ material is preferably 1000° C. or more and 1400° C. or less, more preferably, 1050° C. or more and 1350° C. or less. The growth pressure in the chamber can be, for example, 10 Torr to 760 Torr. More preferably, the growth pressure is 20 Torr to 380 Torr.

The molar ratio of a group V element gas such as $NH_3$ gas to a group III element gas such as TMA gas, calculated based on the growth gas flow rate of the group V element gas and the group III element gas (hereinafter referred to as V/III ratio) can be, for example, 100 or more and 100000 or less. More preferably, the V/III ratio is 300 or more and 30000 or less. Since the growth temperature and the growth pressure determine the optimum V/III ratio, the growth gas flow rate is preferably determined appropriately as in the case of the AlN layer 21.

Subsequently, the p-type contact layer 153 having a two-layer structure is formed on the electron blocking layer 51. The first p-type contact layer 54 is formed directly on the electron blocking layer 51 using a carrier gas containing nitrogen as a main component, whereas the second p-type contact layer 55 is directly formed on the first p-type contact layer 54 using a carrier gas containing hydrogen as a main component.

The term "carrier gas containing nitrogen as a main component" herein means a carrier gas in which the ratio of the volume of nitrogen to the total volume of the carrier gas is 60% or more. More preferably, the volume ratio is 85% or more. Further, the term "carrier gas containing hydrogen as a main component" means a carrier gas in which the ratio of the volume of hydrogen to the total volume of the carrier gas is 60% or more. More preferably, the volume ratio is 85% or more. A pure gas commercially available for semiconductor fabrication may be employed for the carrier gas in this embodiment. Note that the volume ratio of the carrier gas here is tailored for gases supplied into the chamber and flown through a space adjacent to a wafer, and not for gases which are mainly used to purge a heater or the inner wall of the chamber and are exhausted without being flown through a space adjacent to the wafer. Specifically, even when a large amount of hydrogen is flown into a heater or to the inner wall of a chamber and then exhausted, if nitrogen is substantially flown to the vicinity of the wafer, the carrier gas contains nitrogen as a main component.

The p-type contact layer 153 is formed from a p-type $Al_cGa_{1-c}N$ material. The p-type contact layer 153 is a layer for reducing the contact resistance between a p-type electrode 70 to be formed thereon and the electron blocking layer 51. In this regard, the Al content c of the p-type contact layer 153 should satisfy $0\leq c\leq0.1$. Specifically, the Al content x of the first p-type contact layer 54 ($Al_xGa_{1-x}N$) should satisfy $0\leq x\leq0.1$, whereas the Al content y of the second p-type contact layer 55 ($Al_yGa_{1-y}N$) should satisfy $0\leq y\leq0.1$. This can sufficiently reduce the contact resistance between the electron blocking layer 51 and the p-type electrode 70 formed on the p-type contact layer 153. In particular, x=0 and y=0 are preferably satisfied.

A dopant used to impart p-type conductivity to the p-type contact layer 153 may be magnesium (Mg) or zinc (Zn) as with the electron blocking layer 51. Similarly, for the Mg source, bis(cyclopentadienyl)magnesium ($CP_2Mg$) can be used, and for the Zn source, zinc chloride ($ZnCl_2$) can be used.

An example of switching gases according to this embodiment will be described below. After forming the electron blocking layer 51, upon once switching the flow of a metalorganic gas (a group III element gas and a dopant source gas) from into a chamber to a vent, the carrier gas flown into the chamber is switched from hydrogen to nitrogen. After switching the temperature and pressure in accordance with the growth conditions of the p-type contact layer, a metalorganic gas is supplied into the chamber to form the first p-type contact layer 54 on the electron blocking layer 51. Next, upon switching the flow of the metalorganic gas back from into the chamber to the vent, the carrier gas flown into the chamber is switched to hydrogen gas, followed by supplying the metalorganic gas into the chamber, thereby forming the second p-type contact layer 55. This switching is preferred. Changing the carrier gas without switching the flow to the vent would cause abnormal growth due to a rapid change of the gas flow. Note that the group V element gas is kept being flown into the chamber to prevent the group V element from being detached from the electron blocking layer. Further, once switching the flow of the metalorganic gas from into the chamber to the vent as described above interrupts the crystal growth on the electron blocking layer 51. While the atmosphere on the electron blocking layer 51 is switched from hydrogen to nitrogen to achieve a complete nitrogen atmosphere, the electron blocking layer 51 is heated while being exposed to the carrier gas and the group V element gas, with the hydrogen partial pressure being reduced. This may benefit the improvement in the carrier density in the vicinity of the interface between the electron blocking layer 51 and the p-type contact layer 153. After the complete nitrogen atmosphere is achieved, the metalorganic gas is supplied into the chamber after an interval of one second or more in a preferred aspect.

The growth temperature of the p-type contact layer 153 is preferably 800° C. or more and 1400° C. or less, more preferably 900° C. or more and 1300° C. or less. The growth pressure in the chamber can be, for example, 10 Torr to 760 Torr. More preferably, the growth pressure is 20 Torr to 600 Torr.

The molar ratio of a group V element gas such as $NH_3$ gas to a group III element gas such as TMA gas, calculated based on the growth gas flow rate of the group V element gas and the group III element gas (hereinafter referred to as V/III ratio) can be, for example, 100 or more and 100000 or less. More preferably, the V/III ratio is 300 or more and 30000 or less. Since the growth temperature and the growth pressure determine the optimum V/III ratio, the growth gas flow rate is preferably determined appropriately as in the case of the AlN layer 21.

Here, the thickness of the first p-type contact layer 54 is preferably smaller than the thickness of the second p-type contact layer 55. Thus, since the highly crystalline second p-type contact layer 55 having been grown using a carrier gas containing hydrogen as a main component makes up a higher proportion of the whole p-type contact layer 153, the crystallinity of the whole p-type contact layer 153 can be improved and the lifetime of the device can be improved.

In particular, the thickness of the first p-type contact layer 54 is preferably 5 nm or more and 30 nm or less. Thus, the first p-type contact layer 54 is ensured to have a minimum thickness required to prevent the electron blocking layer 51 from being etched due to hydrogen contained in the carrier gas used for forming the second p-type contact layer 55, and the rest can be allocated to the highly crystalline second p-type contact layer 55, thereby maximizing the crystallinity of the whole p-type contact layer 153 and maximizing the improvement in the lifetime.

Lastly, as depicted in Step 2G, after the light emitting layer 40 and the p-type semiconductor layer 150 are partially removed by etching or the like; the n-type electrode 60 is formed on the exposed n-type semiconductor layer 32, and the p-type electrode 70 is formed on the second p-type contact layer 55. Thus, the nitride semiconductor light-emitting device 1 in accordance with a preferred aspect of the first embodiment can be fabricated.

Here, the n-type electrode 60 can be formed, for example, as a metal composite film having a Ti-containing film and an Al-containing film formed on the Ti-containing film. The thickness, shape, and size of each of these films in the n-type electrode can be appropriately selected in accordance with the shape and size of the light-emitting device. Further, the p-type electrode 70 can be formed, for example, as a metal composite film having a Ni-containing film and an Au-containing film formed on the Ni-containing film. The thickness, shape, and size of these films in the p-type electrode can be appropriately selected in accordance with the shape and size of the light-emitting device.

(Second Embodiment: III Nitride Semiconductor Light-emitting Device)

A III nitride semiconductor light-emitting device according to a second embodiment is produced by the above-described method of producing a III nitride semiconductor light-emitting device according to the first embodiment. The resulting III nitride semiconductor light-emitting device 1 has a longer lifetime than conventional devices.

(Third Embodiment: Method of Producing III Nitride Semiconductor Light-emitting Device)

Next, a method of producing a III nitride semiconductor light-emitting device in accordance with a third embodiment will now be described. The method of producing a III nitride semiconductor light-emitting device according to the third embodiment is a method of producing a III nitride semiconductor light-emitting device having an n-type semiconductor layer; a light emitting layer having a quantum well structure including a well layer containing at least Al and a barrier layer; and a p-type semiconductor layer in this order. Here, it is important that the p-type semiconductor layer is formed by the steps including: an electron blocking layer formation step for forming an electron blocking layer having an Al content higher than that of the barrier layer, on the light emitting layer; a nitrogen carrier gas supply step for supplying a carrier gas containing nitrogen as a main component to a surface of the electron blocking layer; and after the nitrogen carrier gas supply step, a second p-type contact formation step for forming a second p-type contact layer made of $Al_yGa_{1-y}N$ ($0 \leq y \leq 0.1$), and the second p-type contact formation step is performed using a carrier gas containing hydrogen as a main component.

In the method of producing a III nitride semiconductor light-emitting device according to the first embodiment, the p-type contact layer 150 having a two-layer structure is provided on the electron blocking layer 51 without providing a p-type cladding layer 52; the first p-type contact layer 54 is formed directly on the electron blocking layer 51 using a carrier gas containing nitrogen as a main component; and the second p-type contact layer 55 is formed on the first p-type contact layer 54 using a carrier gas containing hydrogen as a main component.

As described previously, the inventors found that the lifetime of the III nitride semiconductor device produced by the method according to the first embodiment is improved not because the p-type contact layer 150 having a two-layer structure is formed on the electron blocking layer 51 but because after the electron blocking layer 51 is formed, at least the carrier gas containing nitrogen as a main component is supplied to the surface of the electron blocking layer 51 to expose the surface of the electron blocking layer 51 to the nitrogen containing atmosphere.

The inventors also found that when the above-mentioned carrier gas containing nitrogen as a main component is supplied, a p-type contact layer (the first p-type contact layer 54) is preferably rather not formed (i.e., supplying source gases of Al and Ga is stopped) in terms of the lifetime of the device, and the lifetime of the device can be further improved by exposing the surface of the electron blocking layer 51 to the nitrogen containing atmosphere, followed by forming a p-type contact layer (the second p-type contact layer 55) using a carrier gas containing hydrogen as a main component, as compared to the case where the p-type contact layer has a two-layer structure.

This being the case, in this embodiment, in the above method of producing a III nitride semiconductor light-emitting device according to the first embodiment, the nitrogen carrier gas supply step for supplying at least a carrier gas containing nitrogen as a main component to the surface of the electron blocking layer 51 is performed instead of the step for forming the first p-type contact layer, and the second p-type contact formation step 55 is performed using a carrier gas containing hydrogen as a main component after the nitrogen carrier gas supply step.

The nitrogen carrier gas supply step can be performed with the supply of source gasses of Al and Ga being stopped; alternatively, the first p-type contact layer 54 may be formed directly on the electron blocking layer 51 and directly under the second p-type contact layer 55 by supplying a source gas of Al and Ga. As demonstrated in EXAMPLES below, source gases of Al and Ga are preferably stopped and not supplied in the nitrogen carrier gas supply step in terms of the lifetime of the device.

The time between the start and stop of the supply of the nitrogen gas in the nitrogen carrier gas supply step preferably includes at least time required for evacuating hydrogen remaining in a furnace. The supply time is preferably 30 seconds or more and 600 seconds or less although depending on the size of the furnace. Thus, an interface having good crystallinity can be formed between the electron blocking layer 51 and the second p-type contact layer 55 to be formed later.

When source gases of Al and Ga are supplied to form the first p-type contact layer 54, the layer thickness is preferably 30 nm or less.

In this embodiment, the range of the Al content b of the barrier layers 42 in the light emitting layer 40 can be wider than in the first embodiment, and is preferably 0.35 to 0.95. Further, the electron blocking layer 51 is preferably $Al_zGa_{1-z}N$ ($b<z\leq1$). Further, the method of producing a III nitride semiconductor light-emitting device according to this embodiment is preferred for producing a III nitride semiconductor light-emitting device in which light emitted from the light emitting layer 40 is deep ultraviolet light having a center wavelength of 320 nm or less.

(Fourth Embodiment: III Nitride Semiconductor Light-emitting Device)

A III nitride semiconductor light-emitting device according to a fourth embodiment is produced by the above-described method of producing a III nitride semiconductor light-emitting device according to the third embodiment. The resulting III nitride semiconductor light-emitting device 1 has a longer lifetime than conventional devices.

Thus, a III nitride semiconductor light-emitting device having a longer lifetime than conventional devices can be produced.

EXAMPLES

Example 1

The disclosed method of producing a III nitride semiconductor emitting device will be described in more detail below using examples. However, this disclosure is not limited to the following examples. A III nitride semiconductor light-emitting device was fabricated in accordance with the process steps illustrated in Steps 2A to 2G of FIG. 2. First, a sapphire substrate (diameter: 2 in, thickness: 430 µm, plane direction: (0001), off-angle θ in m-axis direction: 0.5°, terrace width: 100 nm, step height: 0.20 nm) was prepared (Step 2A). Next, an AlN layer having a center thickness of 0.60 µm (average thickness: 0.61 µm) was grown by MOCVD on the above sapphire substrate to obtain an AlN template substrate (Step 2B). On that occasion, the growth temperature of the AlN layer was 1300° C., the growth pressure in the chamber was 10 Torr, and the growth gas flow rate of ammonia gas and TMA gas was set so that the V/III ratio was 163. The flow rate of the group V element gas ($NH_3$) was 200 sccm, and the flow rate of the group III element gas (TMA) was 53 sccm. Note that for the thickness of the AlN layer, the thicknesses of total 25 portions distributed at regular intervals, including the center of the wafer plane were measured using an interference thickness measurement system (Nanospec M6100A manufactured by Nanometrics Incorporated).

Next, the above AlN template substrate was introduced into a heat treatment furnace. After the pressure of the furnace was reduced to 10 Pa, the furnace was purged with nitrogen gas to achieve a nitrogen gas atmosphere in the furnace, followed by raising the temperature inside the furnace, thus performing heat treatment on the AlN template substrate (Step 2C). The heat treatment was performed at a heating temperature of 1650° C. for a heating time of four hours.

Subsequently, an undoped $Al_{0.7}Ga_{0.3}N$ layer made of $Al_{0.7}Ga_{0.3}N$ with a thickness of 1 µm was formed as an undoped layer by MOCVD. Next, on the undoped layer, an n-type $Al_{0.62}Ga_{0.38}N$ layer made of $Al_{0.62}Ga_{0.38}N$ doped with Si with a thickness of 2 µm was formed as an n-type semiconductor layer (Step 2D). Note that according to a result of SIMS analysis, the Si concentration of the n-type semiconductor layer (n-type $Al_{0.62}Ga_{0.38}N$ layer) was $1.0\times10^{19}$ atoms/$cm^3$.

Next, on the n-type semiconductor layer, well layers made of $Al_{0.45}Ga_{0.55}N$ with a thickness of 3 nm and barrier layers made of $Al_{0.65}Ga_{0.35}N$ with a thickness of 7 nm were alternately and repeatedly stacked, thereby forming a light emitting layer having 3.5 pairs of the layers (Step 2E). Of 3.5 pairs, 0.5 pair indicates that the top and bottom layers in the light emitting layer were barrier layers. The wavelength of light emitted from the light emitting layer was 280 nm.

On the light emitting layer, an electron blocking layer made of $Al_{0.68}Ga_{0.32}N$ doped with Mg with a thickness of 40 nm was then formed using hydrogen gas as a carrier gas. Subsequently, a first p-type contact layer made of GaN doped with Mg with a thickness of 10 nm was formed using nitrogen gas as a carrier gas. On that occasion, the growth pressure inside the chamber was 300 mbar. Further, the flow rates of the nitrogen gas used as a carrier gas, $NH_3$ gas, TMG, and $Cp_2Mg$ were 30 slm, 30 slm, 150 sccm, and 1000 sccm, respectively. Subsequently, after the carrier gas was switched to hydrogen gas, a second p-type contact layer doped with Mg with a thickness of 170 nm was formed. The flow rate of the hydrogen gas being a carrier gas was 30 slm, and the other conditions were the same as those in the formation of the first p-type contact layer. The flow rate of the TMG gas was reduced to increase the probability of the presence of Mg in a region of the p-type contact layer with a thickness of 30 nm of the total thickness of 170 nm, the region being in contact with the electrode, and the growth rate was reduced, thereby obtaining a layer having a high Mg concentration. After that, a mask was formed on the second p-type contact layer, and mesa etching was performed by dry etching to expose the n-type semiconductor layer. Next, a p-type electrode made of Ni/Au was formed on the second p-type contact layer, and an n-type electrode made of Ti/Al was formed on the exposed n-type semiconductor layer. Note that the p-type electrode had Ni having a thickness of 50 angstrom and Au having a thickness of 1500 angstrom. Further, the n-type electrode had Ti having a thickness of 200 angstrom and Al having a thickness of 1500 angstrom. Lastly, contact annealing (RTA) was performed at 550° C. to form an electrode. Thus, a III nitride semiconductor light-emitting device in accordance with this disclosure was fabricated.

Example 2

A nitride semiconductor light-emitting device according to Example 2 was fabricated under the same conditions as Example 1 except that the thickness of the first p-type contact layer was 30 nm and the thickness of the second p-type contact layer was 150 nm.

Conventional Example 1

A nitride semiconductor light-emitting device according to Conventional Example 1 was fabricated under the same conditions as Example 1 except that after forming an electron blocking layer, a p-type cladding layer (thickness: 50 nm) made of $Al_{0.35}Ga_{0.65}N$ doped with Mg was formed using hydrogen as a carrier gas, followed by forming a p-type contact layer (thickness: 180 nm) having a single-layer structure, made of GaN doped with Mg using hydrogen as a carrier gas.

Comparative Example 1

A nitride semiconductor light-emitting device according to Comparative Example 1 was fabricated under the same conditions as Example 1 except that the p-type contact layer has a single-layer structure, made of GaN doped with Mg, and the p-type contact layer was formed using hydrogen as a carrier gas without changing the carrier gas from the one used for forming the electron blocking layer.

Comparative Example 2

A nitride semiconductor light-emitting device according to Comparative Example 2 was fabricated under the same conditions as Example 1 except that the p-type contact layer was formed using nitrogen as a carrier gas.

Comparative Example 3

A nitride semiconductor light-emitting device according to Comparative Example 3 was fabricated under the same conditions as Conventional Example 1 except that the p-type contact layer was formed using nitrogen as a carrier gas.

<Evaluation of Light Emission Characteristics>

The light output power Po (mW) of the flip-chip III nitride semiconductor light-emitting device fabricated in accordance with Example 1 was measured at a current of 20 mA using an integrating sphere and was 2.7 mW. Similarly, the device of Example 2 was evaluated; the light output power thereof was measured and was 2.8 mW. On the other hand, the light output power was measured in Conventional Example 1 and Comparative Examples 2 and 3 other than Comparative Example 1 in which no light emission was achieved. The light output powers were 3.1 mW (Conventional Example 1), 2.9 mW (Comparative Example 2), and 3.0 mW (Comparative Example 3), respectively. Thus, in Examples 1 and 2, a light output power comparable to that in Conventional Example 1 and Comparative Examples 2 and 3 was achieved. The results are given in Table 1. In Table 1, when the p-type contact layer had a single-layer structure, the layer is represented as the first p-type contact layer, and the symbol "-" indicates the absence of the second p-type contact layer.

TABLE 1

| | Electron blocking layer | | P-type cladding layer | | 1st p-type contact layer | | 2nd p-type contact layer | | Light output | |
|---|---|---|---|---|---|---|---|---|---|---|
| | Carrier gas | Al content | Presence | Al content | Carrier gas | Thickness (nm) | Carrier gas | Thickness (nm) | power P$_o$ (mW) | Residual output |
| Conventional Example 1 | $H_2$ | 0.68 | yes | 0.35 | $H_2$ | 180 | — | — | 3.1 | 89% |
| Comparative Example 1 | $H_2$ | 0.68 | no | — | $H_2$ | 180 | — | — | No emission | — |
| Comparative Example 2 | $H_2$ | 0.68 | no | — | $N_2$ | 180 | — | — | 2.9 | 94% |
| Comparative Example 3 | $H_2$ | 0.68 | yes | 0.35 | $N_2$ | 180 | — | — | 3.0 | 82% |
| Example 1 | $H_2$ | 0.68 | no | — | $N_2$ | 10 | $H_2$ | 170 | 2.7 | 97% |
| Example 2 | $H_2$ | 0.68 | no | — | $N_2$ | 30 | $H_2$ | 150 | 2.8 | 96% |
| Example 3 | $H_2$ | 0.68 | no | — | $N_2$ | 0 | $H_2$ | 180 | 2.6 | 98% |

Example 3

On the light emitting layer, an electron blocking layer made of $Al_{0.68}Ga_{0.32}N$ doped with Mg with a thickness of 40 nm was formed using hydrogen gas as a carrier gas. Subsequently, the supply of the hydrogen gas being the carrier gas was stopped and the supply of nitrogen gas was started; meanwhile, the supply of metalorganic gas (TMG and Cp$_2$Mg) was stopped. After that, the supply of the nitrogen carrier gas was stopped again and the supply of hydrogen gas was started; meanwhile, the supply of metalorganic gas (TMG and Cp$_2$Mg) was started to start forming the second p-type contact layer made of GaN doped with Mg with a thickness of 180 nm. Here, the time between the start and stop of the supply of the nitrogen gas was 200 seconds, and the flow rates of the nitrogen gas being the carrier gas and NH$_3$ gas during that time were 30 slm and 30 slm, respectively. When the second p-type contact layer was formed, the growth pressure in the chamber was 300 mbar, and the flow rates of hydrogen being the carrier gas, NH$_3$ gas, TMG, and Cp$_2$Mg were 30 slm, 30 slm, 150 sccm, and 1000 sccm, respectively. Thus, a nitride semiconductor light-emitting device according to Example 3 was fabricated under the same conditions as Example 1 except that the thickness of the first p-type contact layer was 0 nm and the thickness of the second p-type contact layer was 180 nm.

<Evaluation of Light Emission Lifetime>

In order to determine the lifetime-characteristics, the residual output of the of the III nitride semiconductor light-emitting device of Example 1 after the device had been energized for six hours (output after 6 h energization/initial light output) was measured and was 97% to the initial output. Similarly, the residual output after 6 h energization was measured in Example 2 and Example 3, and the values were 96% and 98%, respectively. On the other hand, in Conventional Example 1 and Comparative Examples 1 to 3, the residual outputs were 89% (Conventional Example 1), no output (no light emission) (Comparative Example 1), 94% (Comparative Example 2), and 82% (Comparative Example 3). As demonstrated above, the light emission lifetime in Examples 1 to 3 was significantly improved as compared to Conventional Example 1 and Comparative Examples. The results are given in Table 1.

Example 4

A III nitride semiconductor light-emitting device according to Example 4 was fabricated as described below using the AlN template in Example 1. First, an undoped Al$_{0.55}$Ga$_{0.45}$N layer having a thickness of 1 μm was formed as an undoped layer by MOCVD. Next, on the undoped layer, an n-type Al$_{0.45}$Ga$_{0.55}$N layer doped with Si with a thickness of 2 μm was formed as an n-type semiconductor layer (Step 2D). Note that according to a result of SIMS analysis, the Si concentration of the n-type semiconductor layer was $1.0 \times 10^{19}$ atoms/cm$^3$.

Next, on the n-type semiconductor layer, well layers made of Al$_{0.3}$Ga$_{0.7}$N with a thickness of 3 nm and barrier layers made of Al$_{0.5}$Ga$_{0.5}$N with a thickness of 7 nm were alternately and repeatedly stacked, thereby forming a light emitting layer having 3.5 pairs of the layers (Step 2E). Of 3.5 pairs, 0.5 pair indicates that the top and bottom layers in the light emitting layer were barrier layers. The wavelength of light emitted from the light emitting layer was 310 nm.

On the light emitting layer, an electron blocking layer made of Al$_{0.58}$Ga$_{0.42}$N doped with Mg with a thickness of 40 nm was then formed using hydrogen gas as a carrier gas. Next, the supply of the hydrogen gas being a carrier gas was stopped, and the supply of nitrogen gas was started; meanwhile, the supply of a group III element gas and a dopant gas was stopped, followed by a step for cooling from the growth temperature of 1300° C. to a deposition temperature of the p-type contact layer (the second p-type contact layer) of 1050° C. After that, the supply of the nitrogen gas was stopped and the carrier gas was switched to hydrogen gas; meanwhile, the supply of the group III element gas and the dopant gas was resumed to start forming the second p-type contact layer. Note that since the supply of the group III element gas was stopped, the first p-type contact layer grown using the nitrogen carrier gas can be assumed to have a thickness of 0 nm even considering the residual gas. Further the time between the start and stop of the supply of the nitrogen was 200 seconds.

The flow rates of the nitrogen gas and NH$_3$ gas were 30 slm and 30 slm, respectively, and the flow rate of TMG and Cp$_2$Mg was 0 while the nitrogen carrier gas was supplied. When the second p-type contact layer was formed, the growth pressure in the chamber was 300 mbar, and the flow rates of hydrogen being the carrier gas, NH$_3$ gas, TMG, and Cp$_2$Mg were 30 slm, 30 slm, 150 sccm, and 1000 sccm, respectively. Note that the flow rate of the TMG gas was reduced to increase the probability of the presence of Mg in a region of the p-type contact layer with a thickness of 30 nm of the total thickness of 180 nm, the region being in contact with the electrode, and the growth rate was reduced, thereby obtaining a layer having a high Mg concentration.

After that, a mask was formed on the second p-type contact layer, and mesa etching was performed by dry etching to expose the n-type semiconductor layer. Next, a p-type electrode made of Ni/Au was formed on the second p-type contact layer, and an n-type electrode made of Ti/Al was formed on the exposed n-type semiconductor layer. Note that the p-type electrode had Ni having a thickness of 50 angstrom and Au having a thickness of 1500 angstrom. Further, the n-type electrode had Ti having a thickness of 200 angstrom and Al having a thickness of 1500 angstrom. Lastly, contact annealing (RTA) was performed at 550° C. to form an electrode.

Comparative Example 4

A nitride semiconductor light-emitting device according to Comparative Example 4 was fabricated under the same conditions as Example 4 except that the p-type contact layer was formed using nitrogen as a carrier gas.

<Evaluation of Light Emission Characteristics and Lifetime Characteristics>

The light output power Po (mW) of the flip-chip III nitride semiconductor light-emitting device fabricated in accordance with Example 4 was measured at a current of 20 mA using an integrating sphere and was 2.4 mW. On the other hand, surface roughness occurred in Comparative Example 4, which made it impossible to perform dry etching, etc. and eventual chip assembly. Accordingly, the evaluation of the characteristics could not be performed.

The residual output of the of the III nitride semiconductor light-emitting device of Example 4 after the device had been energized for six hours (output after 6 h energization/initial light output) was measured and was 99% to the initial output. The light emission lifetime in Example 4 was significantly improved as compared to Conventional Example 1 and Comparative Examples 1 to 4 (chip assembly was impossible in Comparative Example 4), and was comparable to the results of Examples 1 to 3. The results are given in Table 2. In Table 2, when the p-type contact layer had a single-layer structure, the layer is represented as the first p-type contact layer, and the symbol "-" indicates the absence of the second p-type contact layer.

TABLE 2

| | Electron blocking layer | | P-type cladding layer | | 1st p-type contact layer | | 2nd p-type contact layer | | Light output | |
|---|---|---|---|---|---|---|---|---|---|---|
| | Carrier gas | Al content | Presence | Al content | Carrier gas | Thickness (nm) | Carrier gas | Thickness (nm) | power $P_o$ (mW) | Residual output |
| Example 4 | $H_2$ | 0.58 | no | — | $N_2$ | 0 | $H_2$ | 180 | 2.4 | 99% |
| Comparative Example 4 | $H_2$ | 0.58 | no | — | $N_2$ | 180 | — | — | Poor surface flatness hindered chip assembly | |

INDUSTRIAL APPLICABILITY

Since the disclosed method can significantly improve the lifetime of light-emitting devices, it is useful for producing the devices.

REFERENCE SIGNS LIST 1, 100: III nitride semiconductor light-emitting device
11: Sapphire substrate
11A: Main surface of substrate
21: MN layer
22: Undoped layer
32: N-type semiconductor layer
40: Light emitting layer
41: Well layer
42: Barrier layer
50, 150: P-type semiconductor layer
51: Electron blocking layer
52: P-type cladding layer
53, 153: P-type contact layer
54: First p-type contact layer
55: Second p-type contact layer
60: N-type electrode
70: P-type electrode

The invention claimed is:

1. A method of producing a III nitride semiconductor light-emitting device having an n-type semiconductor layer; a light emitting layer having a quantum well structure including a well layer containing at least Al and a barrier layer; and a p-type semiconductor layer in this order,
   wherein the p-type semiconductor layer is formed by the steps comprising:
   an electron blocking layer formation step for forming an electron blocking layer having an Al content higher than that of the barrier layer, on the light emitting layer;
   a nitrogen carrier gas supply step for supplying at least a carrier gas containing nitrogen as a main component to a surface of the electron blocking layer; and
   a second p-type contact formation step for forming a second p-type contact layer made of $Al_yGa_{1-y}N$, where y satisfies $0 \leq y \leq 0.1$, on the electron blocking layer after the nitrogen carrier gas supply step,
      wherein the second p-type contact formation step is performed using a carrier gas containing hydrogen as a main component, and
      wherein the nitrogen carrier gas supply step is initiated by stopping the supply of source gases of Al and Ga.

2. The method of producing a III nitride semiconductor light-emitting device, according to claim 1, wherein in the nitrogen carrier gas supply step, source gases of Al and Ga are further supplied to form a first p-type contact layer made of $Al_xGa_{1-x}N$, where x satisfies $0 \leq x \leq 0.1$, with a thickness of more than 0 nm and 30 nm or less directly on the electron blocking layer and directly under the second p-type contact layer.

3. The method of producing a III nitride semiconductor light-emitting device, according to claim 1, wherein the barrier layer is made of $Al_bGa_{1-b}N$, where b satisfies $0.35 \leq b \leq 0.95$, and the electron blocking layer is made of $Al_zGa_{1-z}N$, where z satisfies $b < z \leq 1$.

4. The method of producing a III nitride semiconductor light-emitting device, according to claim 1, wherein light emitted from the light emitting layer is deep ultraviolet light having a center wavelength of 320 nm or less.

5. A method of producing a III nitride semiconductor light-emitting device having an n-type semiconductor layer; a light emitting layer having a quantum well structure including a well layer containing at least Al and a barrier layer; and a p-type semiconductor layer in this order,
   wherein the p-type semiconductor layer is formed by the steps comprising:
   an electron blocking layer formation step for forming an electron blocking layer having an Al content higher than that of the barrier layer, on the light emitting layer;
   a first p-type contact formation step for forming a first p-type contact layer made of $Al_xGa_{1-x}N$, where x satisfies $0 \leq x \leq 0.1$, directly on the electron blocking layer, and
   a second p-type contact formation step for forming a second p-type contact layer made of $Al_yGa_{1-y}N$, where y satisfies $0 \leq y \leq 0.1$, directly on the first p-type con contact layer,
      wherein the first p-type contact formation step is performed using a carrier gas containing nitrogen as a main component, and
      the second p-type contact formation step is performed using a carrier gas containing hydrogen as a main component.

6. The method of producing a III nitride semiconductor light-emitting device, according to claim 5, wherein a thickness of the first p-type contact layer is smaller than that of the second p-type contact layer.

7. The method of producing a III nitride semiconductor light-emitting device, according to claim 5, wherein the thickness of the first p-type contact layer is 5 nm or more and 30 nm or less.

8. The method of producing a III nitride semiconductor light-emitting device, according to claim 5, wherein the barrier layer is made of $Al_bGa_{1-b}N$, where b satisfies $0.4 \leq b \leq 0.95$, and the electron blocking layer is made of $Al_zGa_{1-z}N$, where z satisfies $b < z \leq 1$.

9. The method of producing a III nitride semiconductor light-emitting device, according to claim 5, wherein light emitted from the light emitting layer is deep ultraviolet light having a center wavelength of 300 nm or less.

10. The method of producing a III nitride semiconductor light-emitting device, according to claim 5, wherein the electron blocking layer formation step is performed using a carrier gas containing hydrogen as a main component, and the method includes a step for flowing a carrier gas containing nitrogen as a main component without flowing a metalorganic gas after the electron blocking layer formation step.

* * * * *

UNITED STATES PATENT AND TRADEMARK OFFICE
CERTIFICATE OF CORRECTION

PATENT NO. : 10,147,842 B2
APPLICATION NO. : 15/533482
DATED : December 4, 2018
INVENTOR(S) : Takehiko Fujita et al.

Page 1 of 1

It is certified that error appears in the above-identified patent and that said Letters Patent is hereby corrected as shown below:

In the Specification

Column 12, Line 13, please delete "10 Ton" and insert --10 Torr--.

In the Claims

Claim 5, Column 18, Line 32, please delete "$Al_xGa_{l-x}N$" and insert --$Al_xGa_{1-x}N$--.

Signed and Sealed this
Twenty-sixth Day of March, 2019

Andrei Iancu
*Director of the United States Patent and Trademark Office*